United States Patent [19]
Park

[11] Patent Number: 5,687,119
[45] Date of Patent: Nov. 11, 1997

[54] SEMICONDUCTOR MEMORY DEVICE WITH FLOATING GATE ELECTRODE

[75] Inventor: Keun Hyung Park, Chungcheongbuk-do, Rep. of Korea

[73] Assignee: LG Semicon Co., Ltd., Choongchungbook-do, Rep. of Korea

[21] Appl. No.: 646,152

[22] Filed: May 7, 1996

[30] Foreign Application Priority Data

Oct. 5, 1995 [KR] Rep. of Korea ............... 34120/1995

[51] Int. Cl.$^6$ ............................................. G11C 16/06
[52] U.S. Cl. ..................... 365/185.25; 365/185.31; 257/316; 257/326
[58] Field of Search ................ 365/185.01, 185.25, 365/185.1, 185.08, 185.31; 257/315, 316, 326

[56] References Cited

U.S. PATENT DOCUMENTS 5,357,464  10/1994  Shukuri .................. 365/185.08
5,557,566  9/1996   Ochii ..................... 365/185.08

*Primary Examiner*—David C. Nelms
*Assistant Examiner*—Son Mai
*Attorney, Agent, or Firm*—Morgan, Lewis & Bockius LLP

[57] ABSTRACT

A semiconductor memory device comprises a memory cell having a floating gate electrode for storing an electric charge and a switching a element for charging the floating gate electrode with the electric charge and for performing a switching function so as to discharge the electric charge of the floating gate electrode. A method of manufacturing a semiconductor memory device of this type comprises the steps of forming a field insulating film on a substrate of a first conductivity type; forming an impurity region of a second conductivity type on the substrate in a column direction between a plurality of the field insulating films; forming a first gate insulating film on the substrate; forming a floating gate electrode so that impurity regions of the first conductivity type and second conductivity type are repeated on the first gate insulating film and the field insulating film between a plurality of the impurity regions of the second conductivity type; forming a second gate insulating film on the first gate insulating film; forming a control electrode on the second gate insulating film between the field insulating films in a direction perpendicular with respect to the floating gate electrode; and forming a gate electrode of a passing transistor between a plurality of the control electrodes.

12 Claims, 12 Drawing Sheets

SEMICONDUCTOR MEMORY DEVICE WITH FLOATING GATE ELECTRODE

BACKGROUND OF THE INVENTION

1. Field of the Invention

The present invention relates to a semiconductor memory device and, more particularly, to a semiconductor memory device which, although it does not incorporate a capacitor, can be used as a dynamic random access memory (DRAM) cell. The present invention also relates to a method of manufacturing such a semiconductor device.

2. Description of the Related Art

Recently, the semiconductor memory market has been prosperous. In connection with this, there has been a great deal of research advanced and conducted in the area of ultra large scale integration.

However, there are limits to which the realization of ultra large scale integration and large capacity can be accomplished using the current basic memory device structure. Accordingly, a new model of memory device is required.

In general, there are several memory devices having respective characteristics. For example, a DRAM memory device is not limited in its cycling, but is inferior in the density aspect because the unit cell of a DRAM is composed of one storage capacitor and one transistor. On the other hand, an electrically erasable programmable read only memory (EEPROM) device is composed of one stacked transistor. Through a thin tunnel oxide film, a floating gate is charged with electrons or the charged electrons are discharged from the floating gate, to thereby perform "programming" or "erasure" of the cell. Accordingly, the density of the EEPROM is good, but the cycling is limited to about $10^7$ possible programming/erasure occurrences. The DRAM and EEPROM will be described below with reference to the attached drawings.

FIG. 1 is a circuit diagram of a general DRAM cell. FIG. 2 is a cross-sectional view showing the structure of the general DRAM cell.

The conventional DRAM cell is constructed using one bit line (B/L), one word line (W/L), one access transistor (M1), one storage capacitor (Cs), and one sense amplifier (SA). Referring to this structure, a gate (G) of access transistor (M1) is connected to word line (W/L). A drain (D) of access transistor (M1) is connected to bit line (B/L). A source (S) of access transistor (M1) is connected to a first electrode of storage capacitor (Cs). A second electrode of storage capacitor (Cs) is connected to a polysilicon cell plate. Bit line (B/L) is connected to one input terminal of sense amplifier (SA). Another input terminal of sense amplifier (SA) is connected to a reference voltage (Vref).

The structure of the DRAM cell having the aforementioned circuit construction is shown in FIG. 2. That is, a P-type silicon substrate 1 is divided into a field region and an active region, and a field oxide film 2 is formed on the field region. A gate insulating film 3 and a gate electrode 4 are stacked sequentially on the active region of P-type silicon substrate 1. Source/drain regions (S,D), which are N-type impurity regions, are formed in the substrate 1 on both sides of gate electrode 4, thereby forming access transistor (M1).

Further, a first electrode 6 of the capacitor (Cs) is formed on source region (S) of access transistor (M1). A dielectric film 7 and a second electrode 8 are stacked on the surface of first electrode 6 of the capacitor (Cs). Moreover, bit line (B/L) is connected to drain region (D) of access transistor (M1). Reference numerals 5 and 9 designate insulating films.

The operation of the conventional DRAM cell constructed as described above will be explained below. First of all, it is assumed that, during an initial stage of the operation, P-type silicon substrate 1 is grounded and a voltage of Vcc (5V) is applied to second electrode 8 of the capacitor (Cs).

In this case, electrons are accumulated and an inversion layer formed in the surface of the P-type silicon region under second electrode 8. A depletion layer, in turn, is formed under the inversion layer.

Accordingly, in order to write a logic "1" in any one cell, 5V are applied to the bit line connected to drain (D) of access transistor (M1) of the above cell. At the same time, a voltage pulse of 5-6V is applied to the word line connected to gate (G) of access transistor (M1) of the above cell. If so, the access transistor is in an "on" state, so that the potential of the access transistor source of the above cell is raised to 5V.

At this time, the potential of the inversion layer formed in the surface of the P-type silicon region under second electrode 8 will be somewhat lower than 5V. This is because the voltage of 5V applied to second electrode 8 is decreased in some degree through the dielectric film of the storage capacitor located below second electrode 8.

Accordingly, the electrons accumulated in the inversion layer formed in the P-type silicon substrate surface under second electrode 8 flow into the source region of access transistor (M1), whose electron energy state is low. Thus, an empty potential well is formed in the surface of the P-type silicon region under second electrode 8. Such state shows a logic "1" in the binary system.

In order to write a logic "0" in any one cell, bit line (B/L) connected to the drain of the access transistor of the above cell is grounded. At the same time, a voltage pulse of 5-6 V is applied to word line (W/L) connected to the gate of the access transistor of the above cell.

If so, the electrons flow from source region (S) of access transistor (M1) having a high electron energy to the empty potential well formed in the surface of the P-type silicon substrate, thereby filling the empty potential well. Accordingly, the electrons are accumulated in the inversion layer formed in the surface of the P-type silicon substrate under the capacitor. Such state shows a logic "0" in the binary system.

In order to read data from the above cell, bit line (B/L) is precharged to 0.5Vcc (~2.5V), and then a voltage pulse of 5-6V is applied to the word line (W/L) of the above cell. If so, the electric charges charged in the storage capacitor (Cs) of the above cell flow to bit line (B/L), thereby changing the potential of bit line (B/L).

Since sense amplifier (SA) is a comparative circuit, if the potential of the bit line is higher than the reference voltage (~0.5Vcc), a logic "1" is read. If the above potential is lower than the reference voltage, a logic "0" is read.

A displacement potential ($\Delta V$) of bit line (B/L) is expressed by the following equation (1):

$$\Delta V = \pm 0.5 Vcc \, (Cs)/(Cs+Cb) \tag{1}$$

Here, Cs represents the static capacity of the storage capacitor (Cs), and Cb represents the static capacity of the bit line. Further, in equation (1), the (+) symbol corresponds to the case where a logic "1" is stored in the cell. The (−) symbol corresponds to the case where a logic "0" is stored in the cell.

The minimum voltage difference between the reference voltage and the bit line voltage, which can be distinguished by a sense amplifier, can be referred to as a "distinction ability" of the sense amplifier. The distinction ability of the sense amplifier in previous 1M DRAM devices is about 150–200 mV. Therefore, in the case where Vcc is 5V in equation (1), the ratio (r) of the bit line static capacity (Cb) and the storage capacitor static capacity (Cs), where (r=Cb/Cs), must be lower than 15 in order to make ΔV higher than 150 mV. According to a previously published paper, in the case of a 1M DRAM device, Cs was 30–60 fF and Cb was 250–500 fF. Further, r was maintained at 7–15.

In such a general DRAM cell, integration is increased steadily, thereby reducing the size of the cell area. However, the distinction ability of the sense amplifier and the static capacity of the bit line cannot be decreased, as compared to the decrease in the size of the cell. Further, the static capacity of the storage capacitor is not decreased, as compared to the decrease in the size of the cell area.

Moreover, in order to prevent the "soft error" problem, which is among the most significant reliability problems confronted in DRAM technology, it is necessary to maintain the constant size of the static capacity of the storage capacitor. Due to this reason, the reduction of the static capacity of the storage capacitor is small, in spite of the steady increase of the DRAM integration and the reduction of the cell area size.

For example, in the case of a 256K DRAM, a design rule of about 2 mm has been used. In the case of a 256M DRAM, a design rule of about 0.25 μm has been used. Accordingly, the cell area has been decreased by about 100 times.

However, if the static capacity of the storage capacitor is considered, such static capacity is about 40 fF in the 256K DRAM and about 25 fF in the 256M DRAM. Thus, the static capacity has been decreased by about 1.5 times.

In such a general DRAM, the static capacity of the storage capacitor must be maintained at almost the same size, in spite of the increase in integration. Therefore, there is a problem in that the integration has a limit.

Further, in order to form the storage capacitor while minimizing the cell area, a trench is formed in the substrate to thereby form the storage capacitor, or a stacked capacitor structure is used to form the storage capacitor. Thus, the semiconductor manufacturing process becomes complicated. In connection with this, there is a problem in that the semiconductor manufacturing process cost increases substantially.

FIG. 3 is a circuit diagram of a general flash EEPROM cell. FIG. 4 is a cross-sectional view showing the structure of the general flash EEPROM cell.

The general EEPROM cell is comprised of a floating gate avalanche injection metal oxide semiconductor (FAMOS) having a stacked gate transistor structure. A control gate (C.G) of each cell is connected to a word line (W/L). A drain (D) of each cell is connected to a bit line (B/L). A source (S) of each cell is connected to a common source line (C.S).

Further, each bit line (B/L) is connected to an input terminal of a sense amplifier (SA). Another input terminal of sense amplifier (SA) is connected to a reference voltage (Vref).

The structure of the general EEPROM cell having the aforementioned circuit construction is shown in FIG. 4. That is, a floating gate (F.G) and a control gate (C.G) are stacked sequentially on a P-type silicon substrate 1. A source region (S) and a drain region (D) formed from N-type impurity regions are formed in P-type silicon substrate 1 on both sides of floating gate (F.G).

An insulating film is formed between silicon substrate 1, floating gate (F.G), and control gate (C.G). Between floating gate (F.G) and control gate (C.G), the insulating film is formed to a thickness corresponding to the thickness of a gate insulating film of a general transistor. Between floating gate (F.G) and silicon substrate 1, a tunnel oxide film is formed to a thickness of about 100 Å or less.

The operation of such general EEPROM is as follows. First of all, in order to write a logic "1" in a cell, 7–8V are applied to bit line (B/L) corresponding to the above cell. A voltage pulse of 12–13V is applied to word line (W/L). The source (S) and substrate 1 are grounded. If so, avalanche breakdown occurs in the P-N junction between drain (D) and substrate 1, thereby generating hot electrons.

A number of the hot electrons generated as described above obtain an energy level higher than the energy potential height (about 3.2 eV) between the substrate and gate oxide film. Then, from the substrate, the electrons travel over the gate oxide film and enter floating gate (F.G), to be stored therein.

At this time, as the number of electrons stored in floating gate (F.G) gradually increases, the threshold voltage of the cell is increased. In general, "writing" is performed so that the cell threshold voltage is more than 7V.

If the electrons are stored once in floating gate (F.G), the natural electron discharge quantity is negligibly small because of the energy potential height between floating gate (F.G) and the insulating film fully surrounding floating gate (F.G). Therefore, the quantity of the stored electrons may be maintained without any change, even over the course of several years. Such state of the cell shows a logic "1" in the binary system.

Erasing the data written in the cell described above is as follows. That is, the substrate and control gate (C.G) are grounded. A voltage pulse of 12–13V is applied to common source line (C.S). If so, due to the tunneling phenomenon, the electrons stored in floating gate (F.G) pass the thin gate oxide film from floating gate (F.G) and, then, are discharged to source (S).

At this time, as the discharge quantity of the electrons stored in floating gate (F.G) gradually increases, the threshold voltage of the cell begins to decrease. In general, the cell threshold voltage must be 3V or less. Accordingly, such state shows a logic "0" in the binary system.

The process of reading data stored in the memory cell is as follows. That is, 1–2V are applied to bit line (B/L) connected to drain (D) of the cell. The substrate and source (S) are grounded. Then, a voltage pulse of 3–5V is applied to word line (W/L) connected to control gate (C.G) of the cell.

At this time, in the case where a logic "1" is stored in the cell, the cell enters an "OFF" state, so that the electric charges on bit line (B/L) are not discharged and remain as is. Thus, the previously applied potential of 1V is maintained as is.

In the case where a logic "0" is stored in the cell, the cell enters an "ON" state, so that all electric charges on bit line (B/L) are discharged to source (S) through the cell. Thus, the potential of bit line (B/L) is in a ground state. Sense amplifier (SA) connected to bit line (B/L) recognizes such potential difference of bit line (B/L), thereby reading the stored data of the cell.

In the case of such a general flash EEPROM, it is unnecessary to form the storage capacitor (Cs) required in the DRAM cell, so that the area of the unit cell is decreased. In addition, the process associated therewith is simplified.

However, in the DRAM, the number of times of programming/erasure of data is unlimited. On the other hand, in the EEPROM, the possible times of programming/erasure of data is generally limited to $10^7$ or less. Therefore, there is a problem in that the flash EEPROM cannot be used in most applications as a substitute for the DRAM.

This is because, during the programming and erasing of data, a portion of the injected electrons are captured in the gate oxide film when the electrons pass the gate oxide film. Due to the increase of programming/erasure times of data, the captured quantity gradually increases, thereby causing deterioration of the gate oxide film.

If the gate oxide film deteriorates as described above, the speed of programming and erasure is reduced. If the time of programming and erasure is not controlled, the programming threshold voltage is decreased and the erasure threshold voltage is increased, together with the increase of programming/erasure times of data. Accordingly, a so-called "window-closing" phenomenon occurs, such that the device cannot perform the programming/erasure of data after exceeding a predetermined number of times.

SUMMARY OF THE INVENTION

In order to solve the aforementioned problems, it is an object of the present invention to provide a semiconductor memory device wherein each cell is composed of one transistor by using the merits of DRAM and EEPROM, so that integration is improved and the number of times that programming/erasure of data can be carried out is not limited. Additional objects and advantages of the invention will be set forth in the description which follows or will be obvious from the description or may be learned by practice of the invention.

To accomplish the objects of the present invention, there is provided a semiconductor memory device comprising a memory cell having a floating gate electrode for storing an electric charge, and a switching element for charging the floating gate electrode with the electric charge and for performing a switching function so as to discharge the electric charge of the floating gate electrode.

To further accomplish the objects of the present invention, there is also provided a method of manufacturing a semiconductor memory device comprising the steps of forming a field insulating film having an island shape on a semiconductor substrate of a first conductivity type; forming an impurity region of a second conductivity type on the semiconductor substrate of the first conductivity type in a column direction between a plurality of the field insulating films; forming a first gate insulating film on an entire surface of the substrate and the filed insulating film; forming a floating gate electrode so that impurity regions of the first conductivity type and second conductivity type are repeated on the first gate insulating film and the field insulating film between a plurality of the impurity regions of the second conductivity type; forming a second gate insulating film on an entire surface of the first gate insulating film and the floating gate electrode; forming a control electrode on the second gate insulating film between the field insulating films in a direction perpendicular with respect to the floating gate electrode; and forming a gate electrode of a passing transistor between a plurality of the control electrodes.

It is to be understood that both the foregoing general description and the following detailed description are exemplary and explanatory only. They should not be construed as being restrictive of the invention as claimed.

DETAILED DESCRIPTION OF THE PREFERRED EMBODIMENT

Hereinafter, an embodiment of a semiconductor memory device of the present invention will be described with reference to the attached drawings.

In the circuit structure of a semiconductor memory device according to the present invention, a plurality of memory cells (stacked transistors M1,1–Mn,2 for use as data memory) having a floating gate (F,G) and a control gate (C,G) are arranged. Corresponding to stacked transistors (M1,1–Mn,2) for use as data memory, there are formed passing transistors Q1,1–Qn,2 which switch so as to charge, with electric charges, each floating gate (F,G) of stacked transistors (M1,1–Mn,2) for use as data memory, and so as to discharge the charged electric charges and perform programming or erasure of the cell.

Further, in the semiconductor memory device constructed as described above, control gates (C,G) of each stacked transistor for use as data memory of the same column are connected to a word line (W/L1–W/Ln). Drains (D) of each stacked transistor for use as data memory of the same row and sources of each stacked transistor for use as data memory of the neighboring row are connected in common to respective bit lines (B/L1–B/L3).

Also, an input terminal of a sensing amplifier (SA) is connected to each bit line (B/L1–B/L3) and a reference voltage is applied to its other input terminal. The end terminal of each bit line (B/L1–B/L3) is arranged to be floating.

Each passing transistor (Ql.1–Qn2) of the same column is connected to a gate line (G/L1–G/Ln). Each passing transistor of the same row is connected in series. A drain terminal of the tip is arranged to be floating.

Figure 6:
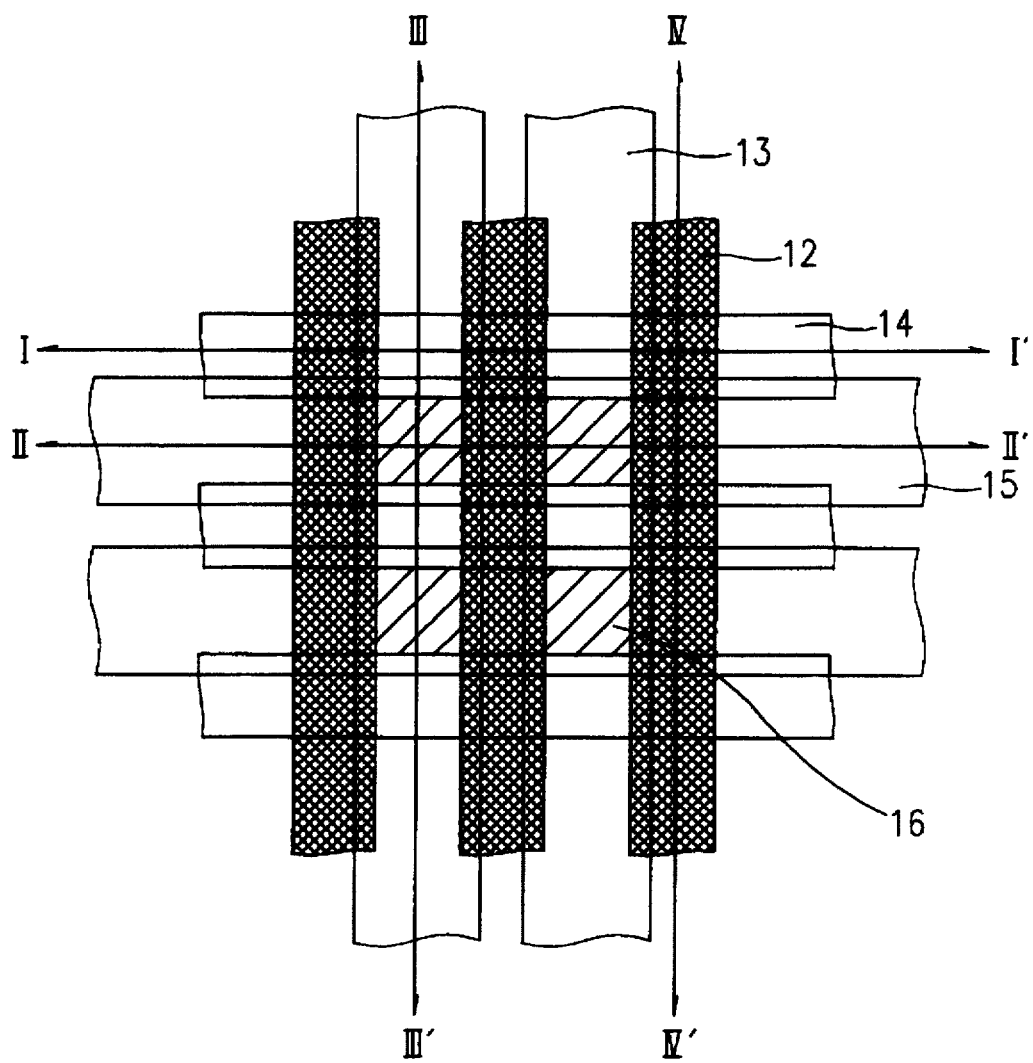
FIG. 6 is a layout diagram of a semiconductor memory device according to an embodiment of the present invention.

The structure of a semiconductor memory device according to an embodiment of the present invention having such circuit construction is shown in FIG. 6, FIG. 7, FIG. 8, FIG. 9 and FIG. 1. That is, as shown in FIG. 6, a plurality of high concentration N-type impurity regions 12, which are to be used as bit lines, are spaced apart by a constant distance and formed in one direction in a P-type silicon substrate. On the P-type silicon substrate between the respective high concentration N-type impurity regions 12, a plurality of floating gate semiconductor layers (polycrystalline silicon) 13 for storing electric charges are formed so as to be isolated from the P-type silicon substrate.

Further, on the substrate, a plurality of control electrodes 14 used as word lines (W/L) are formed spaced apart by a constant distance in the perpendicular direction with respect to floating gate semiconductor layers 13. On the substrate between the respective control electrodes 14, there are formed a plurality of passing gate electrodes 15 for controlling each passing transistor (M1.1–Mn2).

Each floating gate semiconductor layer 13 under control electrode 14 is formed as a high concentration N-type impurity layer (N⁺). Each floating gate semiconductor layer 13 under passing gate electrode 15 is formed as a P-type impurity layer (P). Further, in the silicon substrate under the portion where passing gate electrode 15 and floating gate semiconductor layer 13 cross, a field oxide film 16 having an island shape is formed.

Figure 7:
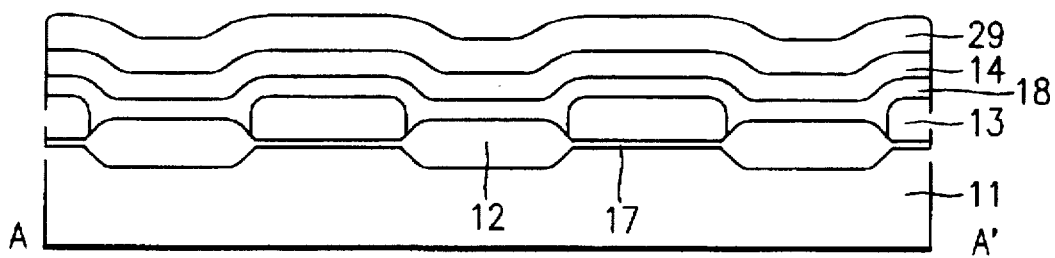
FIG. 7 is a cross-sectional view showing the structure of the semiconductor memory device according to the present invention, taken along line I–I' in FIG. 6.

The semiconductor memory device of the present invention having the aforementioned layout will be described in more detail, as follows. To begin with, the cross-section of the control electrode in FIG. 6 is shown in FIG. 7. High concentration N-type impurity regions 12 which will be used as bit lines are formed in a P-type silicon substrate 11, being spaced apart by a constant distance. A first gate insulating film 17 is formed on the entire surface of P-type silicon substrate 11. A floating gate semiconductor layer 13 is formed on first gate insulating film 17 between the respective high concentration N-type impurity regions 12.

A second gate insulating film 18 is formed on the entire surface of P-type silicon substrate 11 including floating gate semiconductor layer 13. A control electrode 14 is formed on second gate insulating film 18.

Figure 8:
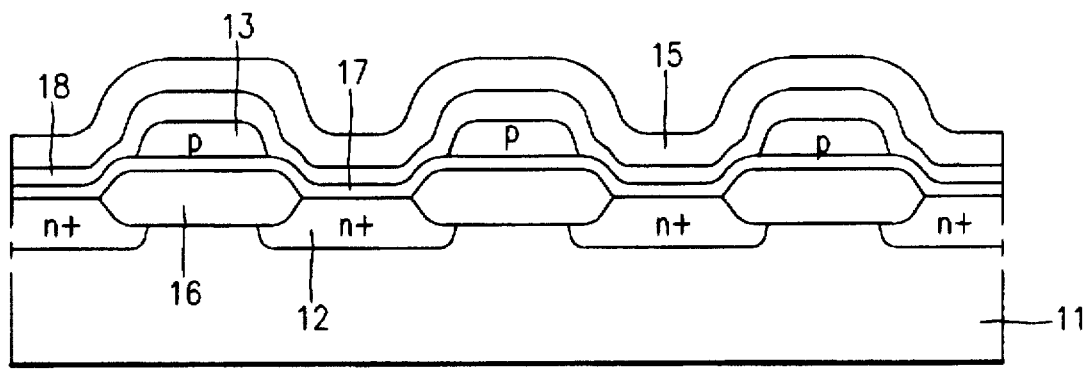
FIG. 8 is a cross-sectional view showing the structure of the semiconductor memory device according to the present invention, taken along line II–II' in FIG. 6.

The cross-section of the passing gate electrode direction in FIG. 6 is shown in FIG. 8. High concentration N-type impurity regions 12, which will be used as bit lines, are formed in P-type silicon substrate 11, being spaced apart by a constant distance.

A field oxide film 16 having an island shape is formed on P-type silicon substrate 11 at the portion where each floating gate semiconductor layer 13 and each passing get electrode cross. First gate insulating film 17 is formed on the entire surface of P-type silicon substrate 11. Floating gate semiconductor layer 13 is formed on first gate insulating film 17 between the respective high concentration N-type impurity regions 12.

Second gate insulating film 18 is formed on the entire surface of P-type silicon substrate 11 including floating gate semiconductor layer 13. A passing gate electrode 15 is formed on second gate insulating film 18.

Figure 9:
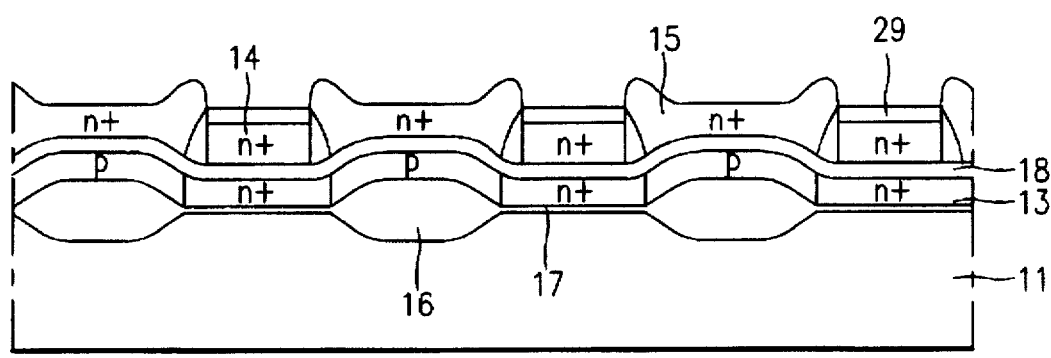
FIG. 9 is a cross-sectional view showing the structure of the semiconductor memory device according to the present invention, taken along line III–III' in FIG. 6.

The cross-section of the floating gate semiconductor layer direction in FIG. 6 is shown in FIG. 9. Field oxide film 16 having an island shape is formed on P-type silicon substrate 11 at the portion where the floating gate semiconductor layer and passing gate electrode cross. First gate insulating film 17 is formed on the entire surface of P-type silicon substrate 11.

Floating gate semiconductor layer 13 is formed on first gate insulating film 17. Second gate insulating film 18 is formed on the entire surface of P-type silicon substrate 11 including floating gate semiconductor layer 13.

A plurality of control electrodes 14 are formed on second insulating film 18, the control electrodes being spaced apart by a constant distance. A plurality of passing gate electrodes 15 are formed on second gate insulating film 18 between the respective control electrodes 14, so as to be isolated by control electrode 14 and insulating film 29.

Figure 10:
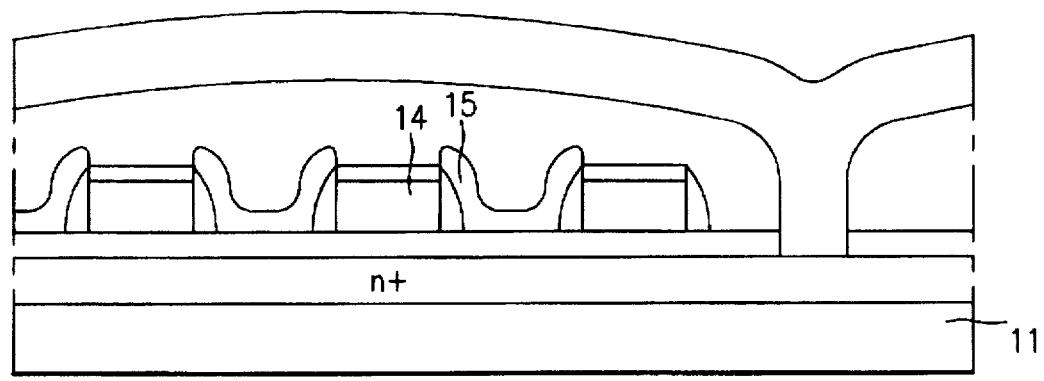
FIG. 10 is a cross-sectional view showing the structure of the semiconductor memory device according to the present invention, taken along line IV–IV' in FIG. 6.
Figure 11A:
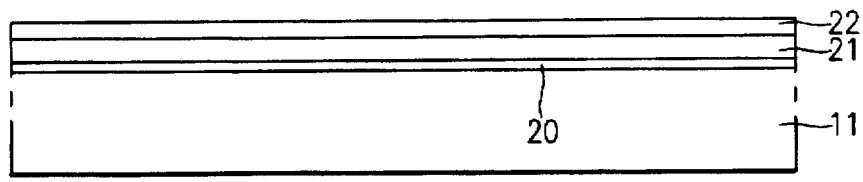
FIGS. 11a through 11j are cross-sectional views illustrating a method of manufacturing the semiconductor memory device according to the present invention, taken along the line I–I' in FIG. 6.
Figure 11B:
Figure 11C:
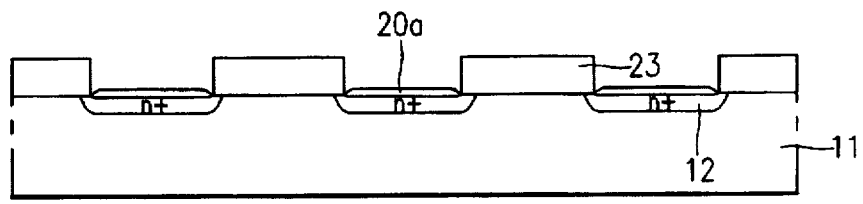
Figure 11D:
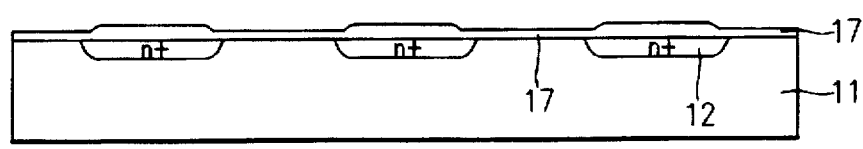
Figure 11E:
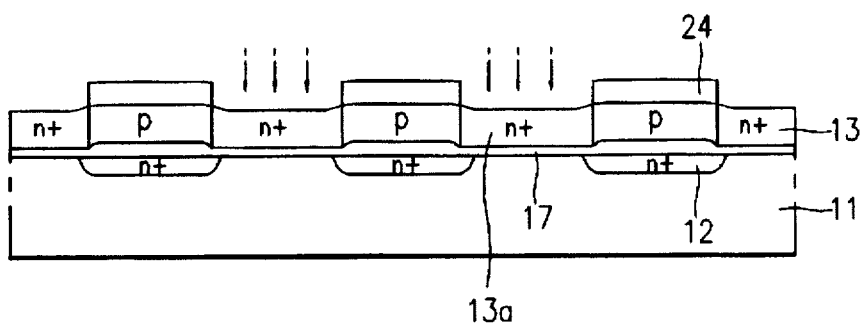
Figure 11F:
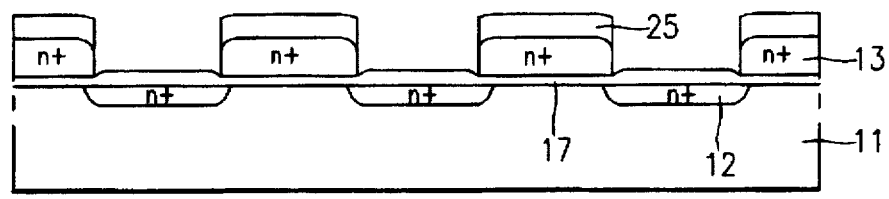
Figure 11G:
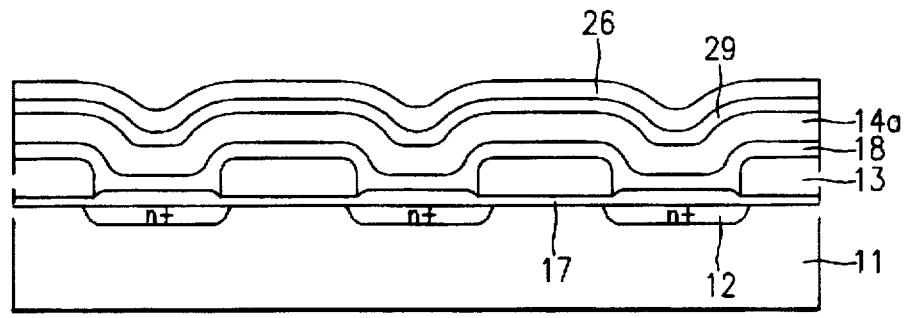
Figure 11H:
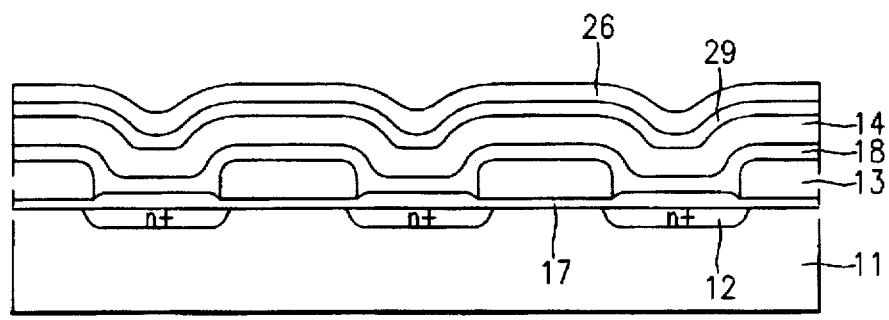
Figure 11I:
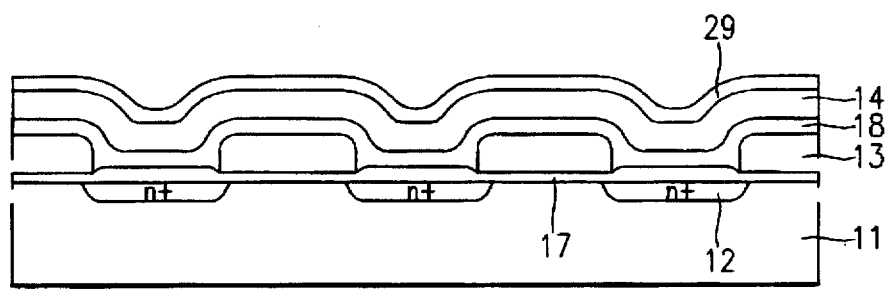
Figure 11J:
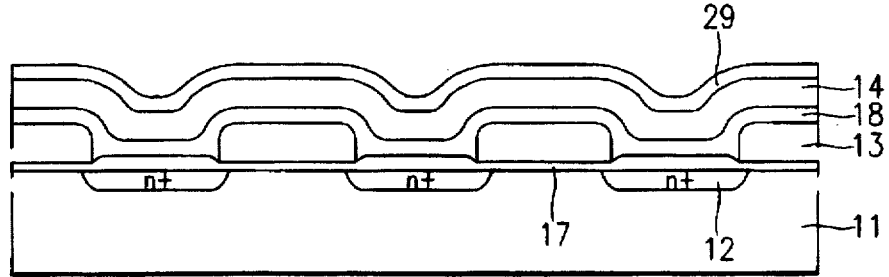
Figure 12A:
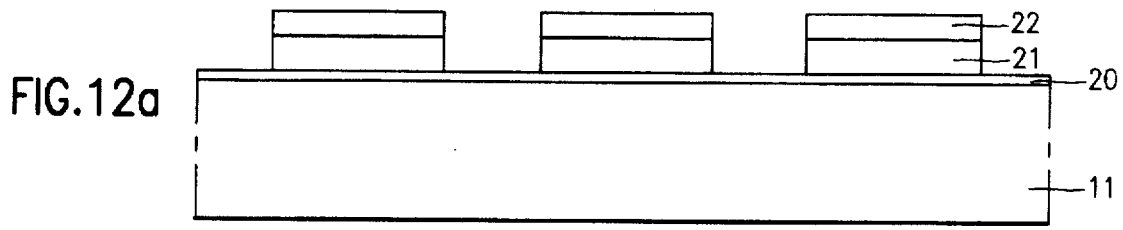
FIGS. 12a through 12j are cross-sectional views illustrating a method of manufacturing the semiconductor memory device according to the present invention, taken along the line II–II' in FIG. 6.
Figure 12B:
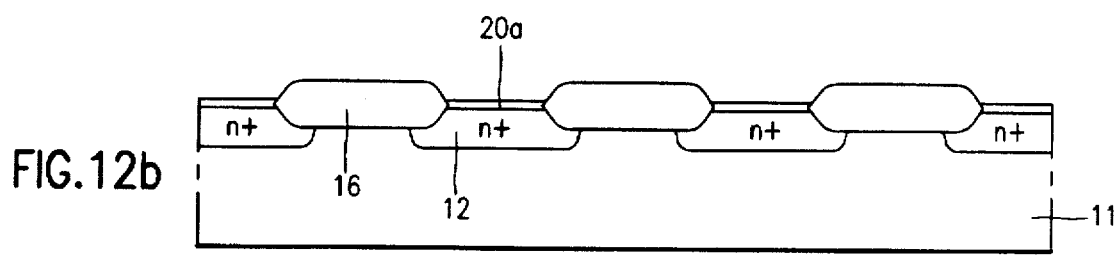
Figure 12C:
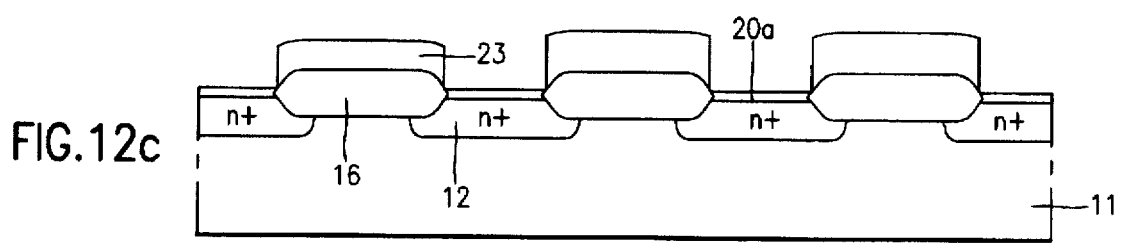
Figure 12D:
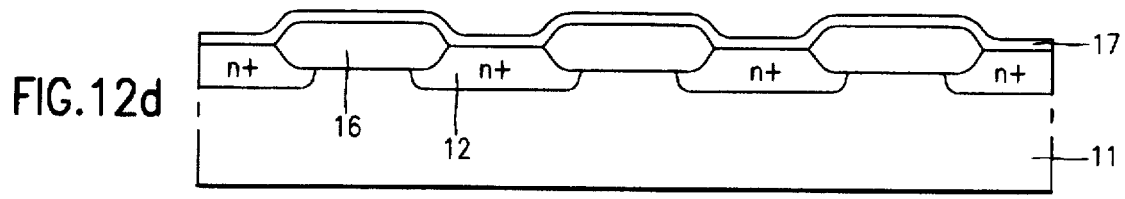
Figure 12E:
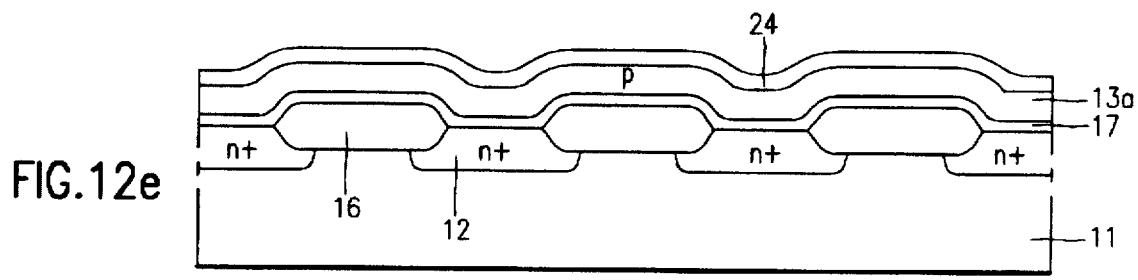
Figure 12F:
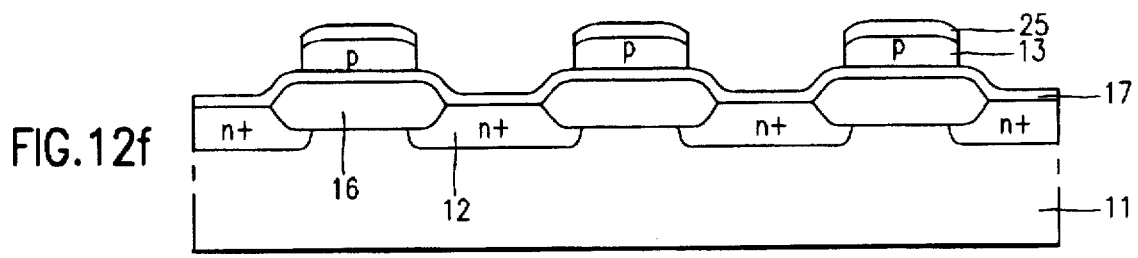
Figure 12G:
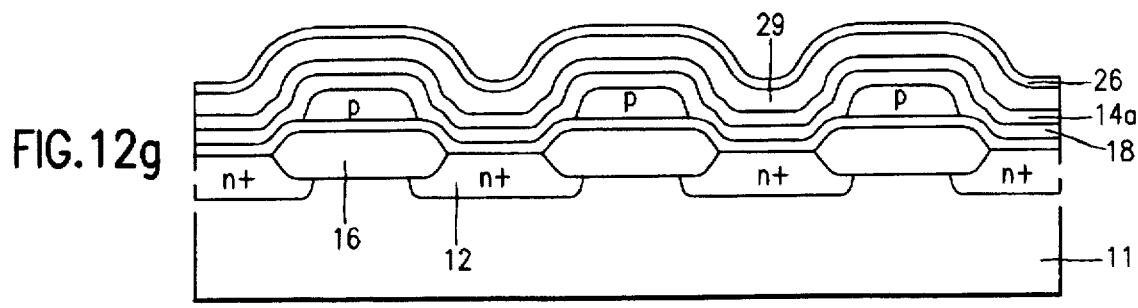
Figure 12H:
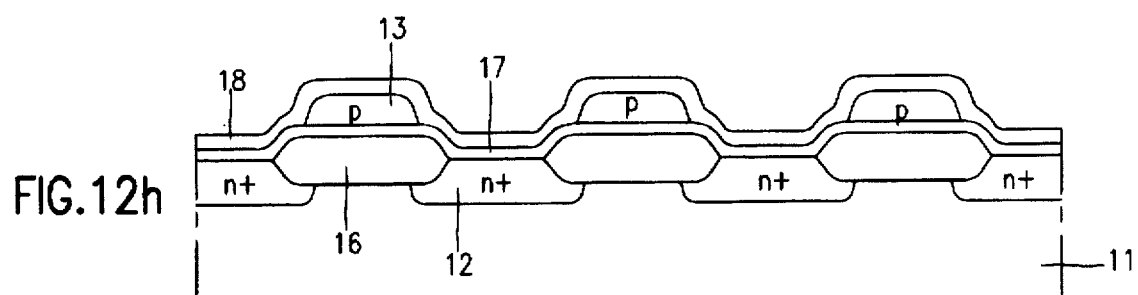
Figure 12I:
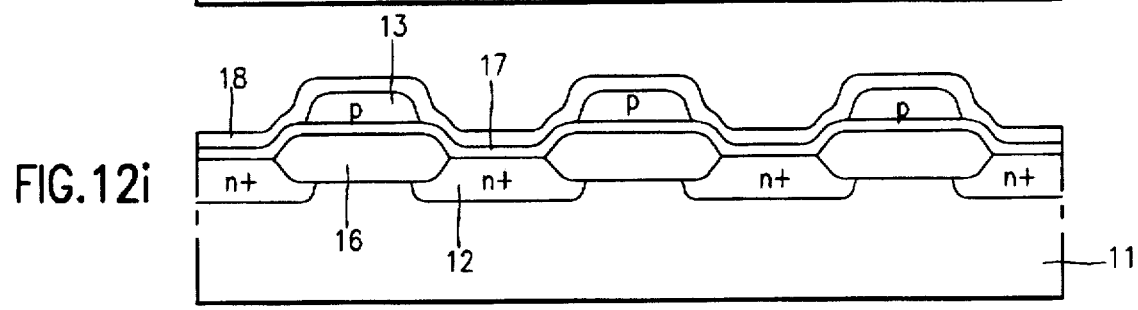
Figure 12J:
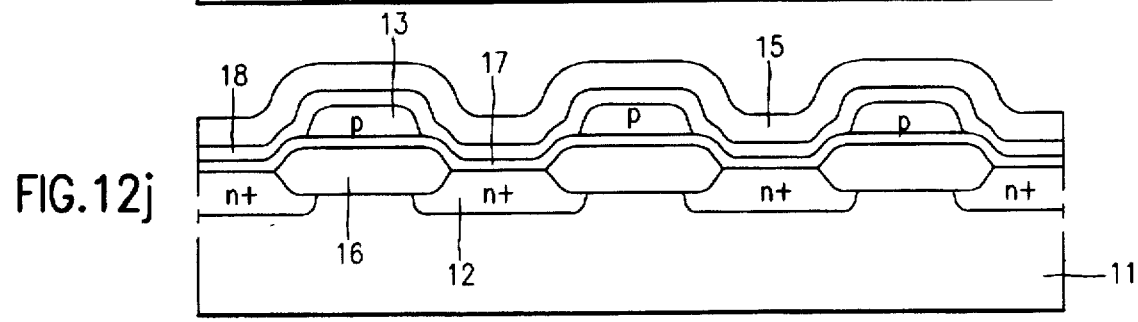
Figure 13A:
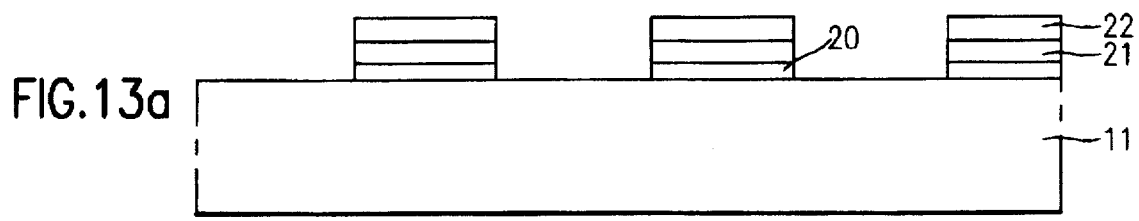
FIGS. 13a through 13j are cross-sectional views illustrating a method of manufacturing the semiconductor memory device according to the present invention, taken along the line III–III'in FIG. 6.
Figure 13B:
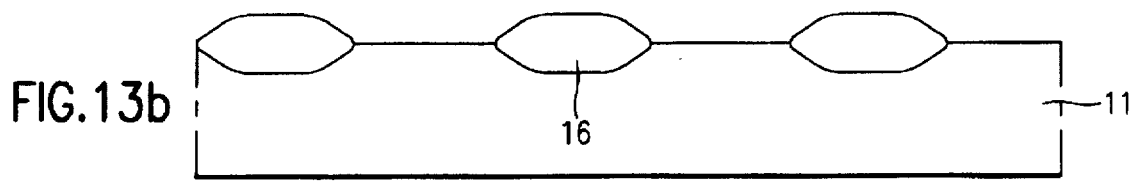
Figure 13C:
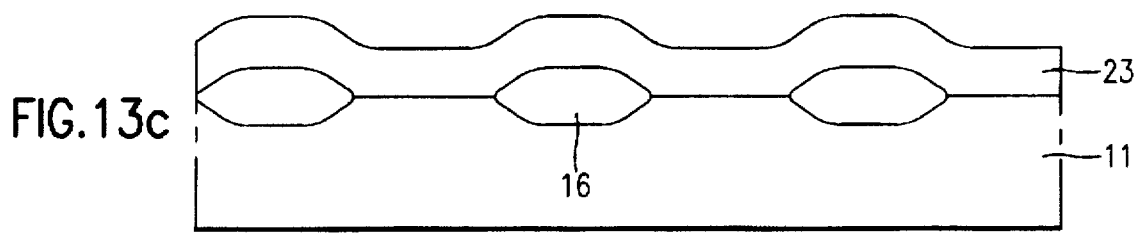
Figure 13D:
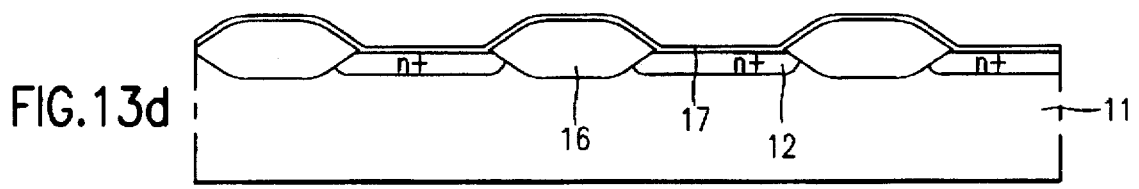
Figure 13E:
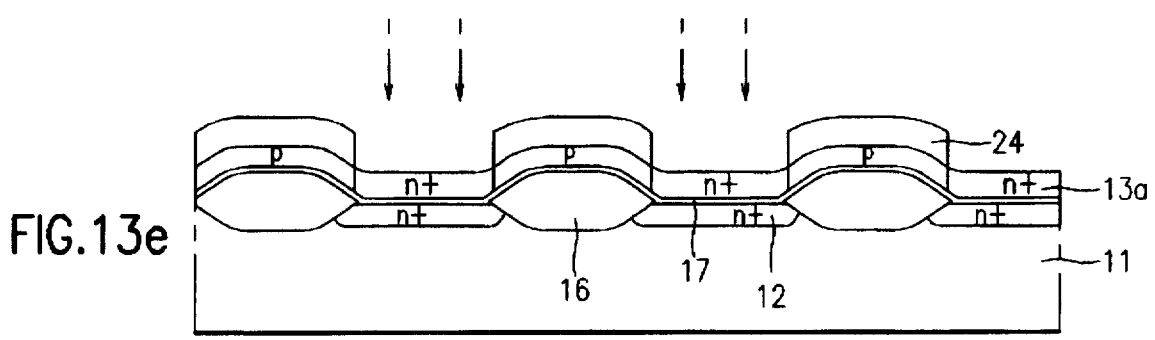
Figure 13F:
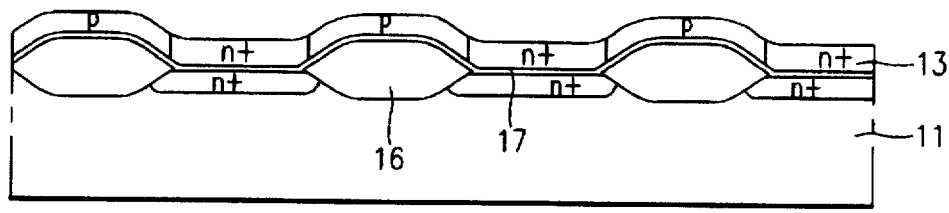
Figure 13G:
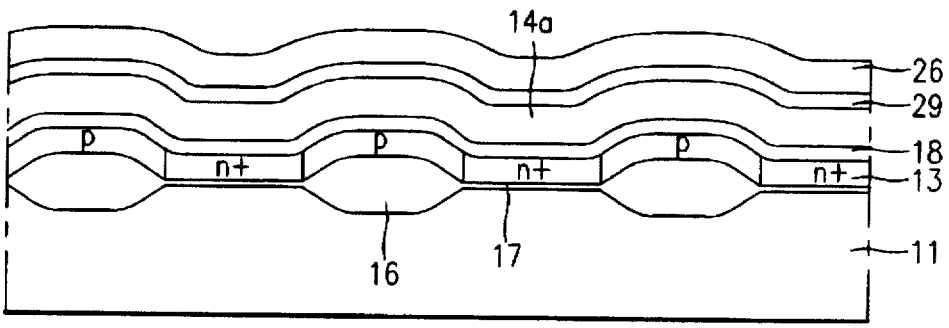
Figure 13H:
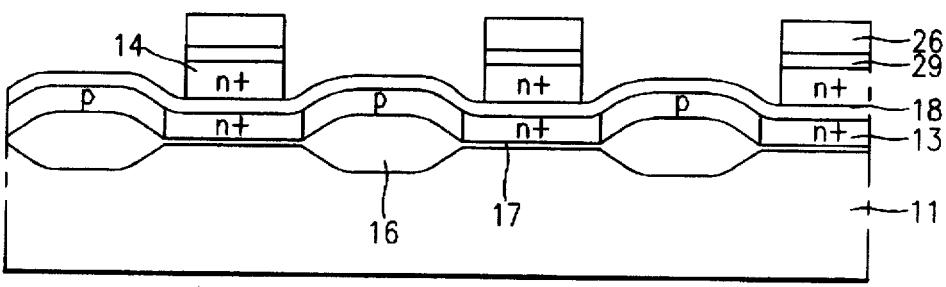
Figure 13I:
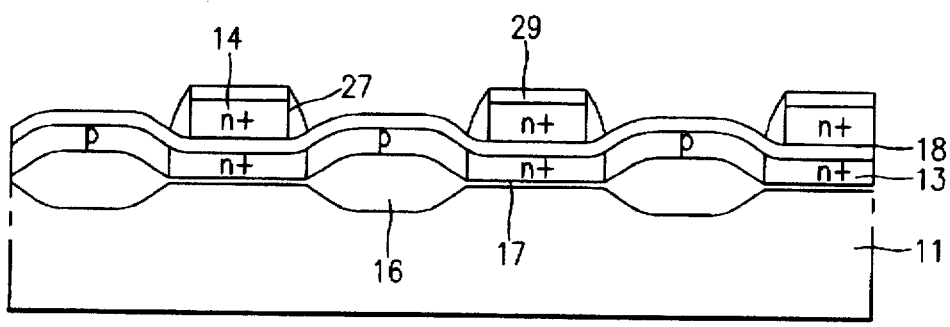
Figure 13J:
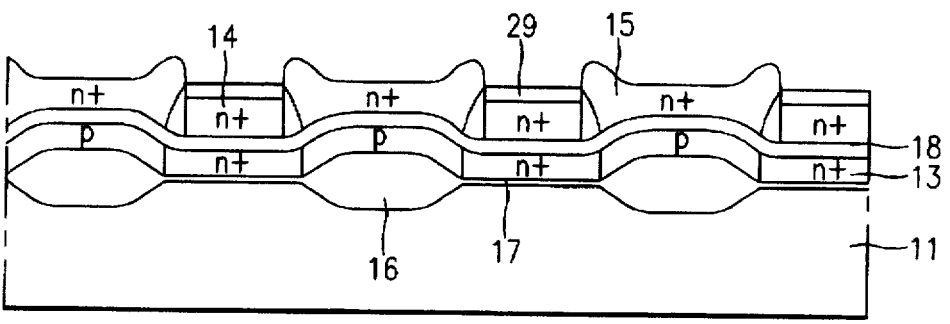
Figure 14A:
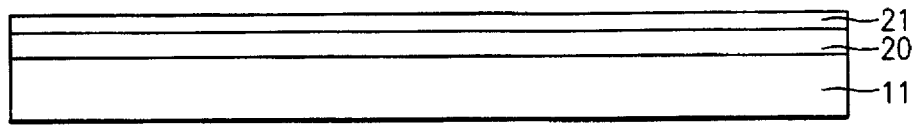
FIGS. 14a through 14j are cross-sectional views illustrating a method of manufacturing the semiconductor memory device according to the present invention, taken along the line IV–IV' in FIG. 6.
Figure 14B:
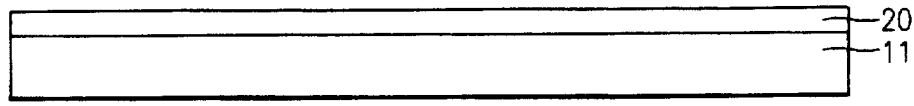
Figure 14C:
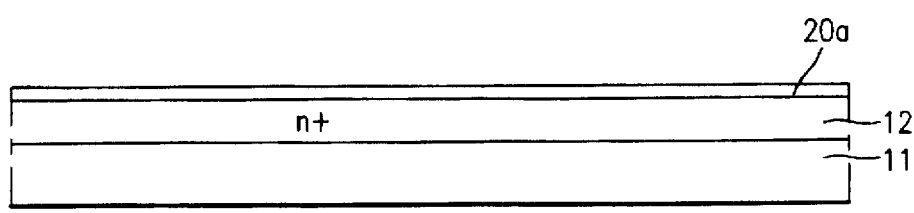
Figure 14D:
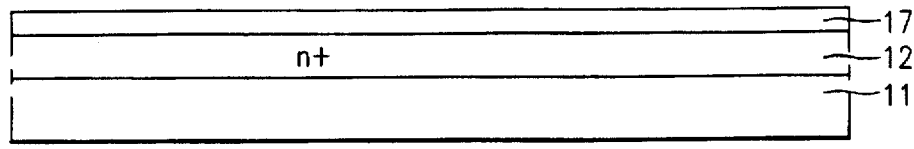
Figure 14E:
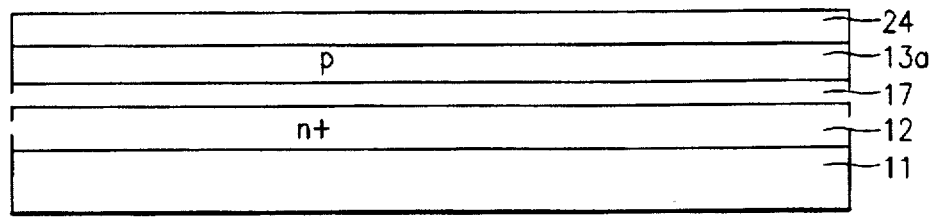
Figure 14F:
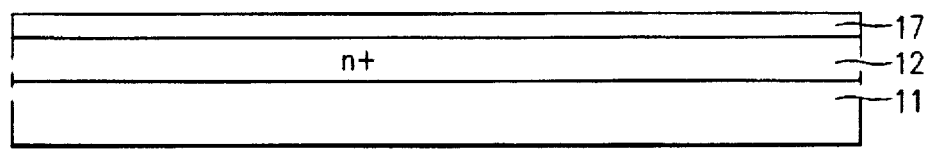
Figure 14G:
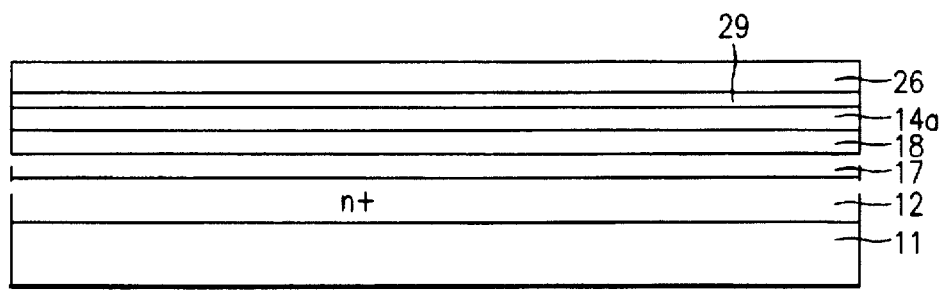
Figure 14H:
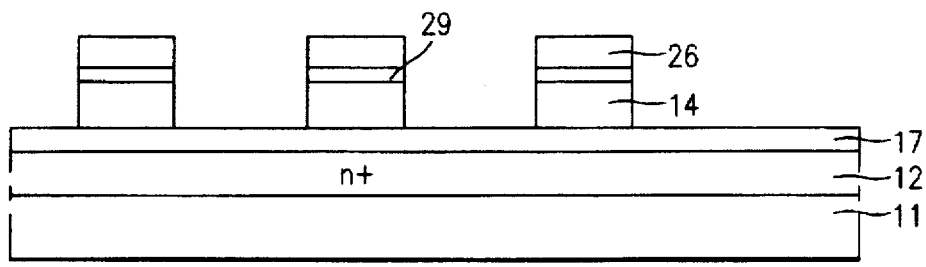
Figure 14I:
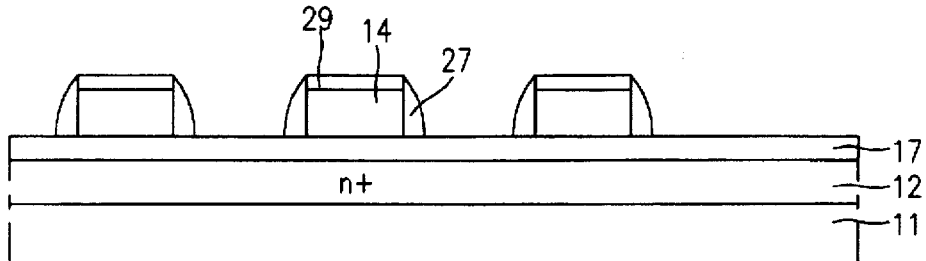
Figure 14J:
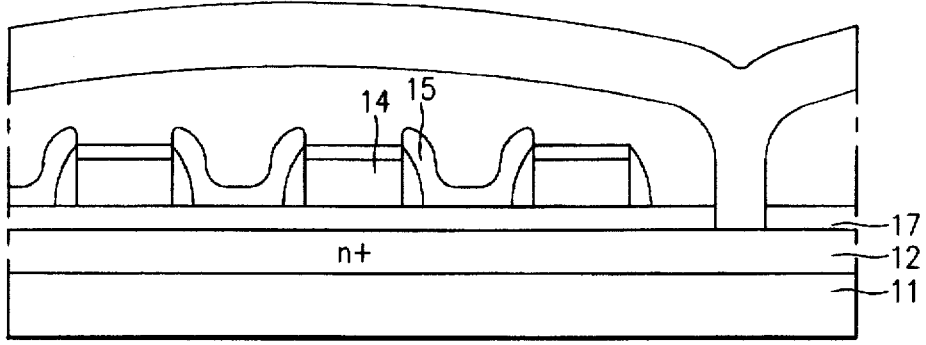

The cross-section of the high concentration N-type impurity region direction in FIG. 6 is shown in FIG. 10. High concentration N-type impurity regions 12, which will be used as bit lines, are formed in a P-type silicon substrate 11. First gate insulating film 17 and second gate insulating film 18 are formed on the entire surface of p-type silicon substrate 11. A plurality of control electrodes 14 are formed on second gate insulating film 18, the control electrodes being spaced apart by a constant distance. A plurality of passing gate electrodes 15 are formed on second gate insulating film 18 between the respective control electrodes 14, so as to be isolated by control electrode 14 and insulating film 19.

A method of manufacturing the semiconductor memory device of the present invention having the aforementioned structure will be described below. Such description will be provided with reference to FIGS. 11a through 11j, 12a through 12j, 13a through 13j, and 14a through 14j.

To begin with, as shown in FIG. 11a, FIG. 12a, FIG. 13a, and FIG. 14a, a buffer oxide film 20, a nitride film 21, and a first resist film 22 are formed sequentially on P-type silicon substrate 11. A field region having an island shape is defined through an exposure and development process, thereby selectively removing nitride film 21 from the field region.

As shown in FIG. 11b, FIG. 12b, FIG. 13b, and FIG. 14, P-type silicon substrate 11 is thermally oxidized, thereby forming a field oxide film 16 in the field region. Then, first resist film 22, nitride 21, and oxide film 20 are removed. Alternatively, instead of using field oxide film 16, it is possible to form the channel isolation region by implanting P-type ions.

As shown in FIG. 11c, FIG. 12c, FIG. 13c, and FIG. 14c, a second resist film 23 is deposited. Through the exposure and development process, a bit line region is defined so as to be spaced apart by a constant distance. A high concentration N-type ion is implanted on P-type silicon substrate 11, thereby forming a high concentration N-type impurity region 12. At this time, an oxide film 20a is formed on the portion of the structure where high concentration N-type impurity region 12 is formed.

As shown in FIG. 11d, FIG. 12d, FIG. 13d, and FIG. 14d, second resist film 23 is removed. A first gate insulating film (oxide film) 17 is deposited to a thickness of about 70–200 Å on the entire surface of P-type silicon substrate 11 including field oxide film 16.

As shown in FIG. 11e, FIG. 12e, FIG. 13e, and FIG. 14e, a P-type polycrystalline silicon layer 13a and a third resist film 24 are deposited sequentially on first gate insulating film 17. Through the exposure and development process, third resist film 24 is patterned so as to expose P-type polycrystalline silicon layer 13a at the portion where a control electrode 14 and a floating gate semiconductor layer 13 cross. Then, using patterned third resist film 24 as a mask, an N-type impurity ion is implanted on exposed P-type polycrystalline silicon layer 13a. At this time, the P-type impurity concentration of P-type polycrystalline silicon layer 13a is about $10^{15}$–$10^{18}$ a atoms/cm$^3$. The N-type impurity ion-implantation concentration is about $10^{18}$–$10^{21}$ atoms/cm$^3$.

As shown in FIG. 11f, FIG. 12f, FIG. 13f, and FIG. 14f, third resist film 24 is removed. Then, a fourth resist film 25 is deposited on P-type polycrystalline silicon layer 13a. A floating gate region is defined through the exposure and development process. P-type polycrystalline silicon layer 13a is selectively removed, thereby forming a floating gate semiconductor layer 13 on first gate insulating firm 17 between respective high concentration N-type impurity regions 12.

The processes shown in FIG. 11(e), FIG. 11(f), FIG. 12(e), FIG. 12(f), FIG. 13(e), FIG. 13(f), FIG. 14(e), and FIG. 14(f) may be modified. For example, P-type polycrystalline silicon layer 13a may be deposited and removed selectively, thereby forming floating gate semiconductor layer 13. Then, N-type impurity ions may be selectively implanted on the portion where floating gate semiconductor layer 13 and control electrode 14 cross.

As shown in FIG. 11g, FIG. 12g, FIG. 13g, and FIG. 14g, a second gate insulating film 18 is deposited on the entire surface of first gate insulating film 17, including floating gate semiconductor layer 13. Then, a first N-type polycrystalline silicon layer 14a, a cap insulating film nitride film), and nitride film), and a fifth resist film 26 are deposited sequentially.

An oxide film may be used as second gate insulating film 18. Alternatively, a structure wherein nitride film/oxide film are stacked, or a structure wherein oxide film/nitride film/ oxide film are stacked, may be used. The N-type impurity concentration of first N-type polycrystalline silicon layer 14a is about $10^{18}$–$10^{21}$ atoms/cm$^3$.

As shown in FIG. 11h, FIG. 12h, FIG. 13h, and FIG. 14h, a control electrode region is defined through the exposure and development process. Then, cap insulating film 29 and first N-type polycrystalline silicon layer 14a are selectively removed, thereby forming a control electrode 14. Alternatively, instead of using first N-type polycrystalline silicon layer 14a, it is possible to use a metal.

As shown in FIG. 11i, FIG. 12i, FIG. 13i, and FIG. 14i, an insulating film is deposited on the entire surface of second gate insulating film 18, including control electrode 14, and then etched back, thereby forming an insulating sidewall 27 on the sidewall of control electrode 14. At this time, most of exposed second gate insulating film 18 has been removed.

As shown in FIG. 11j, FIG. 12j, FIG. 13j, and FIG. 14j, a third gate insulating film 19, a high concentration second N-type polycrystalline silicon 15a, and a sixth resist film 28 are deposited on first gate insulating film 18 including control electrode 14. Then, a passing gate region is defined through the exposure and development process. Second N-type polycrystalline silicon layer 15a is selectively removed, thereby forming a passing gate electrode 15. Here, a metal may be used as the material constituting passing gate electrode 15.

The operation of the semiconductor device of the present invention manufactured as described above will now be described. To begin with, a method of recording data in each cell of the semiconductor device will be described.

When a portion of data is recorded, a voltage of 2–10V is applied to the substrate. All control electrodes 14 are made to float, and the corresponding bit line is grounded.

A voltage of 5V is applied to the gate electrode of all passing transistors (Q1,1–Qn2), to thereby turn on all such passing transistors. A voltage corresponding to the data which will be recorded in a memory cell of the lowest row (n) is applied to a source terminal of the passing transistor.

To record a logic "1", –3V are applied to the source terminal of the corresponding passing transistor. To record a logic "0", 0V is applied to the source terminal of the corresponding passing transistor. Accordingly, data are recorded in the memory cells of one row at the same time. If a segment of the data is recorded in the cell of the lowest row (n) as described above, 0V is applied to the gate electrode of the lowest (n) passing transistor of each column. Alternatively, the gate electrode is floated. Thus, the lowest (n) passing transistor is turned on.

Further, according to the data which will be recorded in a memory cell of the directly previous row (n–1), a voltage is applied to the source terminal of the corresponding passing transistor through the method as described above. Using the aforementioned method, data are recorded in all cells and all passing transistors are turned on.

In another embodiment, when a segment data is recorded, a voltage of –2 to –7V is applied to the corresponding bit line and the substrate is grounded. Thus, the data can be recorded by the aforementioned method.

Figure 1:
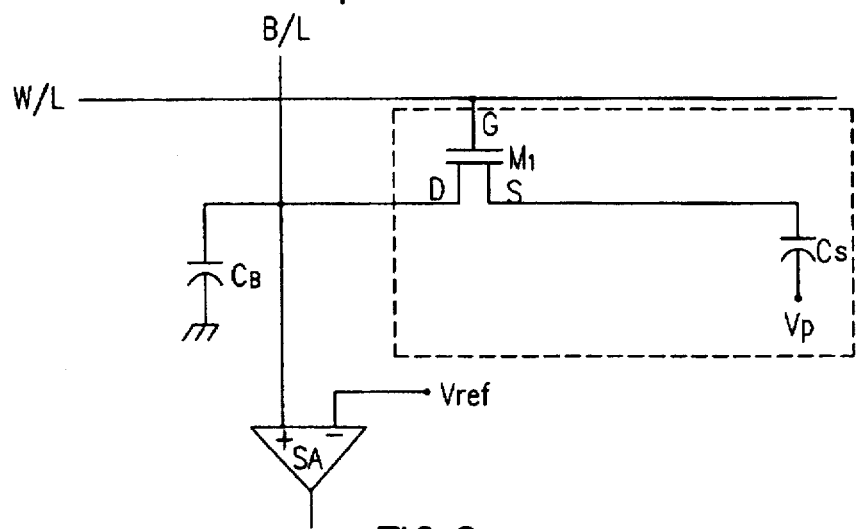
FIG. 1 is a circuit diagram of a general DRAM cell.
Figure 2:
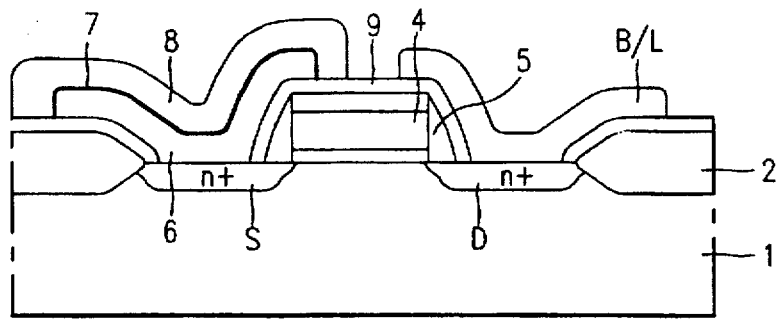
FIG. 2 is a cross-sectional view showing the structure of the general DRAM cell.
Figure 3:
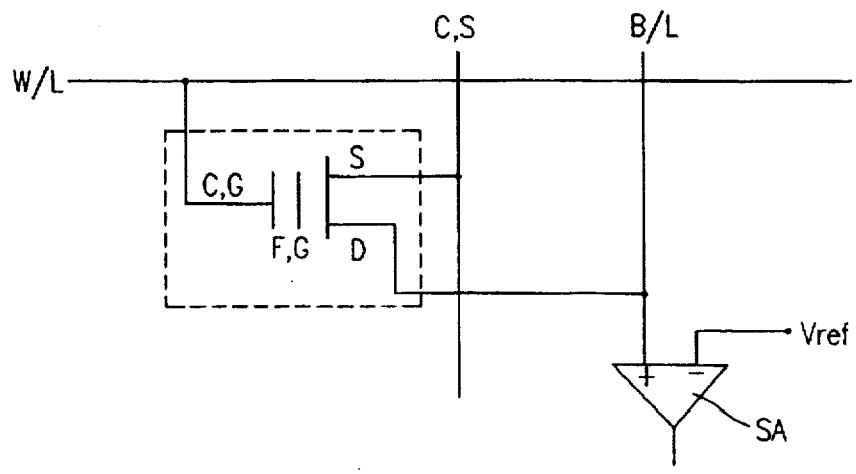
FIG. 3 is a circuit diagram of a general flash EEPROM cell.
Figure 4:
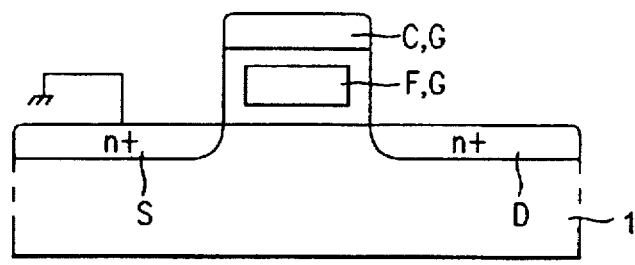
FIG. 4 is a cross-sectional view showing the structure of the general flash EEPROM cell.
Figure 5:
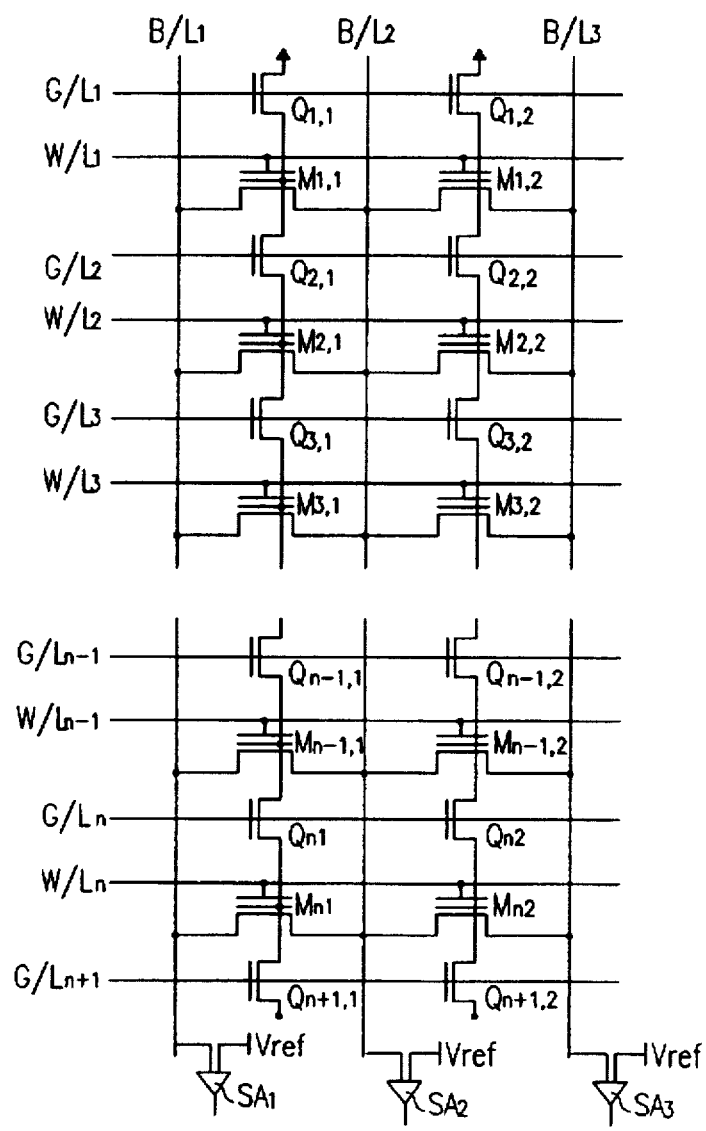
FIG. 5 is a circuit diagram of a semiconductor memory device according to the present invention.

A method of reading the data recorded as described above will now be described. To read the data of the stacked transistor (M2,2) for use as a data memory in FIG. 5, a second bit line (B/L2) is precharged by 2V in a state where all passing transistors (Q1,1–Qn2) are turned on. A third bit line (B/L3) is grounded, and the same voltage as that applied to bit line (B/L2) is applied to a first bit line (B/L1). Alternatively, first bit line (B/L1) is floated. A voltage is applied to the word line (W/L2) of a memory cell (M2,2) to be read, thereby reading the data through sensing simplifier (SA).

If a logic "1" is recorded in the stacked transistor (M2,2) for use as a data memory, since a channel is not formed between the source and drain of the cell, a voltage of 2V applied to the first bit line is detected by the sensing amplifier and produced. Thus, a logic "1" is read.

Further, in the case where a logic "0" is recorded in the stacked transistor (M2,2) for use as a data memory, since the channel is formed between the source and drain of the stacked transistor (M2,2), a voltage of 2V applied to the second bit line passes to the third bit line. Thus, a logic "0" is read in the sensing amplifier (SA).

Here, even if the logic "1" or "0" is recorded in the stacked transistor (M1,2) for use as a data memory, the channel is not formed between the source and drain of the stacked transistor (M1,2) because the first bit line (B/L1) is floated. Thus, there is no problem in reading the data. In addition to such method, data can be recorded and read by several methods, depending on the design condition.

The semiconductor memory device according to the present invention as described above has the following effects.

First, the present invention uses a stacked transistor as a memory element, as in the general flash EEPROM. However, unlike the structure of the general flash EEPROM, the programming or erasure of the cell is performed by using the passing transistor, so as to charge the floating gate of the stacked transistor with electrons or to precharge the charged electrons in the floating gate. Since the capture of electrons is not generated in the gate insulating film, the programming or erasure of the data is not limited. Thus, the present invention can be used as a DRAM in future applications.

Second, a capacitor is generally used as a memory element in a DRAM. On the other hand, no capacitor is used in the present invention. Thus, as compared to the DRAM, the area of the unit cell can be reduced, thereby improving integration.

Third, in the general DRAM, the process is complicated because the capacitor is formed with a trench or crown shape in order to obtain large capacitance in the unit area. However, no capacitor is used in the present invention, thereby simplifying the process.

Those skilled in the art will recognize that various modifications and variations can be applied to the present invention without departing from the spirit and scope thereof. In this regard, other embodiments of the invention will be apparent to those skilled in the art from consideration of the specification and practice of the invention. It is intended that the specification and examples be considered as exemplary only, with the true scope and spirit of the invention being indicated by the following claims and, their equivalents.

What is claimed is:

1. A semiconductor memory device comprising:
   a plurality of memory cells each having a floating gate electrode; and
   a plurality of switching elements for charging the floating gate electrode of each memory cell with an electric charge and for performing a switching function to discharge the electric charge;
   wherein the plurality of switching elements are connected in series.

2. The semiconductor memory device as claimed in claim 1, wherein each of the plurality of memory cells comprises:
   a control electrode for controlling the charging and discharging of the electric charge of the floating gate electrode; and
   a bit line for reading data stored in the floating gate electrode.

3. The semiconductor memory device as claimed in claim 2, wherein multiple bit lines are formed in the plurality of memory cells, and a sensing amplifier is connected to each bit line.

4. The semiconductor memory device as claimed in claim 1, wherein each of the plurality of switching elements comprises a MOS transistor.

5. A semiconductor memory device comprising:
   a plurality of memory cells arranged in a matrix, each of the memory cells having a floating gate and a control gate;
   a plurality of switching elements for charging the floating gate of each memory cell with an electric charge and for performing a switching function so as to discharge each electric charge;
   a plurality of word lines connected to the control gate of each memory cell in a same column of the matrix;
   a plurality of bit lines connected in common to a drain of each memory cell in a same row of the matrix and a source of each memory cell in a neighboring row of the matrix; and
   a plurality of sensing amplifiers connected to each bit line;
   wherein each switching element of the same column of the matrix is connected to one gate line, and the switching elements in the same row of the matrix are connected in series.

6. The semiconductor memory device as claimed in claim 5, wherein an end terminal of each bit line is floated.

7. The semiconductor memory device as claimed in claim 5, wherein a drain terminal of each switching element of each row is floated.

8. A semiconductor memory device comprising:
   a plurality of memory cells arranged in a matrix, each of the memory cells having a floating gate and a control gate; and
   a plurality of switching elements for charging the floating gate of each memory cell with an electric charge and for performing a switching function so as to discharge each electric charge;
   wherein each switching element of the same column of the matrix is connected to one gate line, and the switching elements in the same row of the matrix are connected in series.

9. The semiconductor memory device as claimed in claim 8, further comprising a plurality of word lines connected to the control gate of each memory cell in a same column of the matrix.

10. The semiconductor memory device as claimed in claim 8, further comprising a plurality of bit lines connected in common to a drain of each memory cell in a same row of the matrix and a source of each memory cell in a neighboring row of the matrix.

11. The semiconductor memory device as claimed in claim 10, further comprising a plurality of sensing amplifiers connected to each bit line.

12. The semiconductor memory device as claimed in claim 8, wherein each of the plurality of switching elements comprises an MOS transistor.

* * * * *